United States Patent
Kim et al.

(10) Patent No.: US 8,292,608 B2
(45) Date of Patent: Oct. 23, 2012

(54) APPARATUS FOR FIXING PLASTIC SHEET AND METHOD OF FABRICATING NANO PATTERN ON PLASTIC SHEET USING THE SAME

(75) Inventors: Kyung Hyun Kim, Daejeon (KR); Chul Huh, Daejeon (KR); Hyun Sung Ko, Daejeon (KR); Jong Cheol Hong, Daejeon (KR); Wan Joong Kim, Gyunggi-do (KR); Gun Yong Sung, Daejeon (KR); Seon Hee Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 147 days.

(21) Appl. No.: 12/743,117

(22) PCT Filed: May 21, 2008

(86) PCT No.: PCT/KR2008/002814
§ 371 (c)(1),
(2), (4) Date: May 14, 2010

(87) PCT Pub. No.: WO2009/069866
PCT Pub. Date: Jun. 4, 2009

(65) Prior Publication Data
US 2010/0264567 A1 Oct. 21, 2010

(30) Foreign Application Priority Data

Nov. 30, 2007 (KR) .................. 10-2007-0123156

(51) Int. Cl.
*B29C 43/32* (2006.01)
(52) U.S. Cl. .................... 425/122; 264/447; 425/405.1; 425/403.1
(58) Field of Classification Search .............. 264/447; 425/122, 403.1, 405.1
See application file for complete search history.

(56) References Cited

U.S. PATENT DOCUMENTS
5,460,921 A  10/1995  Cywar et al.
(Continued)

FOREIGN PATENT DOCUMENTS
JP   2004-22571   1/2004
(Continued)

OTHER PUBLICATIONS

Choi, Charles J. et al., "Single-step fabrication and characterization of photonic crystal biosensors with polymer microfluidic channels," Lab. Chip., vol. 6:1373-1380 (2006).

*Primary Examiner* — Yogendra Gupta
*Assistant Examiner* — Alison Hindenlang
(74) *Attorney, Agent, or Firm* — Nelson Mullins Riley & Scarborough LLP; EuiHoon Lee, Esq.

(57) ABSTRACT

There are provided an apparatus for fixing a plastic sheet which fixes a plastic sheet to fabricate a nano pattern and a method of fabricating a nano pattern on a plastic sheet using the same. The apparatus for fixing a plastic sheet includes: a pair of planar metal guide rings interposingly fixing a plastic sheet from above and below, respectively; and a sheet fixing chuck including: a ring fixer sucking the pair of planar metal guide rings through a vacuum groove to be fixed thereto; and a sheet fixer having a plurality of vacuum pin holes formed therein, the vacuum pin holes sucking a bottom of the plastic sheet fixed by the planar metal guide rings. The apparatus allows fabrication of the nano pattern on the plastic sheet having less roughness than that of a semiconductor substrate or a glass substrate.

7 Claims, 3 Drawing Sheets

U.S. PATENT DOCUMENTS

| | | | |
|---|---|---|---|
| 5,925,302 A * | 7/1999 | Oono et al. | 264/267 |
| 6,656,398 B2 | 12/2003 | Birch et al. | |
| 6,900,881 B2 * | 5/2005 | Sreenivasan et al. | 355/72 |
| 2006/0102290 A1 | 5/2006 | Harada et al. | |
| 2006/0192320 A1 * | 8/2006 | Tokita et al. | 264/293 |

FOREIGN PATENT DOCUMENTS

| | | |
|---|---|---|
| JP | 2004-314238 | 11/2004 |
| KR | 1020050099888 | 10/2005 |
| KR | 1020060051138 | 5/2006 |
| KR | 1020060073764 | 6/2006 |

* cited by examiner

APPARATUS FOR FIXING PLASTIC SHEET AND METHOD OF FABRICATING NANO PATTERN ON PLASTIC SHEET USING THE SAME

RELATED APPLICATIONS

This application is a 35 U.S.C. §371 national stage filing of PCT Application No. PCT/KR2008/002814 filed on May 21, 2008, which claims priority to, and the benefit of, Korean Patent Application No. 10-2007-0123156 filed on Nov. 30, 2007. The contents of the aforementioned applications are hereby incorporated by reference.

TECHNICAL FIELD

The present invention relates to a fabrication method of a nano pattern and an application technology thereof, and more particularly, to an apparatus for fixing a plastic sheet which fixes a plastic sheet to fabricate a nano pattern and a method of fabricating a nano pattern using the same.

The work related to the present invention was supported by the IT R&D program of MIC/IITA [Project No. 2006-S-007-02, project title: Ubiquitous Health Monitoring Module and System Development].

BACKGROUND ART

There are largely two technologies for fabricating a nano pattern on a substrate. One is electronic beam lithography in which lithography is performed using an electronic beam, followed by etching. The other is imprinting in which a nano pattern is transferred onto a substrate using a stamp.

In the electronic beam lithography, mainly, a nanometer pattern is formed on an electronic resist (ER) and then etched to fabricate a final pattern. Meanwhile, in the imprinting, an organic nano pattern is formed on the substrate using a stamp made of silicon or crystal. The substrate for forming the pattern thereon is limited to a rigid substrate such as a semiconductor or glass substrate. This is because the rigid substrate is not deformed or wrecked during etching or heat treatment.

Of the aforesaid technologies, the electronic beam lithography necessarily entails heat treatment due to characteristics of the electron resist (ER). Therefore, this technology does not allow use of a plastic sheet made of e.g., polymer having a thickness of 1000 micro meter or less.

Also, in the case of imprinting, mostly, the substrate needs to be very superior in surface roughness to have a nanometer pattern formed thereon, even though there may be some differences depending on the type of equipment.

Accordingly, a problem with the imprinting is that the nano pattern cannot be formed on a substrate having a thickness less than a predetermined level. For example, in a case where Imprio series of MII corp., is employed, a substrate having a surface roughness of 10 micrometer or less does not ensure a nano pattern to be formed stably and repeatedly.

Consequently, the nano pattern cannot be directly imprinted on a plastic substrate whose surface roughness is relatively higher than the semiconductor substrate or glass substrate, where the nanao pattern can be formed.

However, the nano pattern may have to be formed on the plastic substrate. Here, as the most common method, the nano pattern may be formed by one of the aforesaid two technologies, that is, electronic beam lithography for forming the nano pattern on the semiconductor substrate made of e.g., silicon or the imprinting.

Thereafter, with the semiconductor substrate serving as a master, the plastic substrate is heated to a melting point or more to be melted. Then, the melted substrate is poured into the master to form a pattern. Subsequently, temperature is lowered and the master is etched or destroyed to fabricate a nano pattern on the plastic substrate.

Alternatively, another metal master having a pattern reversed with respect to that of the pre-made master is manufactured by electroplating the pre-made master with a metal such as Ni. Then in an identical process as above, a plastic substrate is heated and melted to be poured into the metal master, thereby forming a pattern. Subsequently, the metal master is cooled, and then etched and destroyed to form a nano pattern. A process of forming the nano pattern on the plastic substrate by metal mold injection as described above is not cost-efficient due to considerably high manufacturing costs of a metal mold. Besides, the molding process involves a heating process to require expensive molding equipment, thereby increasing manufacturing and maintenance costs.

DISCLOSURE OF INVENTION

Technical Problem

With the conventional method, a nano pattern is fabricated through a very complexity process and at considerable costs. Accordingly, the conventional method is not suitable for fabricating a bio diagnosis kit requiring a low production cost or an external pattern for increasing light emitting efficiency of an optical device.

Therefore an aspect of the present invention is to provide an apparatus for fixing a plastic sheet which is employed to fabricate a nano pattern on a plastic sheet easily applicable with various substrate materials, for example, a semiconductor substrate made of silicon, a transparent substrate made of glass and a plastic substrate, regardless of material type of the substrate, and a method of fabricating a nano pattern using the same.

Technical Solution

According to an aspect of the invention, the invention provides an apparatus for fixing a plastic sheet including: a pair of planar metal guide rings interposingly fixing a plastic sheet from above and below, respectively; and a sheet fixing chuck including: a ring fixer sucking the pair of planar metal guide rings through a vacuum groove to be fixed thereto; and a sheet fixer having a plurality of vacuum pin holes formed therein, the vacuum pin holes sucking a bottom of the plastic sheet fixed by the planar metal guide rings.

The vacuum groove may be formed along an outer periphery of the sheet fixing chuck so as to suck the planar metal guide rings.

According to another aspect of the invention, the invention provides a method of fabricating a nano pattern using an apparatus for fixing a plastic sheet, the method including: sucking a pair of planar metal guide rings interposingly fixing a plastic sheet from above and below to be fixed to a ring fixer, and sucking a bottom of the plastic sheet through a plurality of vacuum pin holes formed in a sheet fixer to be fixed to the sheet fixer; coating an ultraviolet-curable polymer resin on the plastic sheet; pressing the coated polymer resin with an imprint stamp having a nano pattern; ultraviolet-curing the polymer resin; and removing the imprint stamp from the substrate.

The method may further include attaching the plastic sheet having the nano pattern thereon onto one of a plastic substrate, a glass substrate and a semiconductor substrate using one of plasma treatment and adhesive.

The ultraviolet-curable polymer resin may be acrylate-based.

The coating an ultraviolet-curable polymer resin may include coating the polymer resin to a thickness greater than a maximum depth of the pattern of the imprint stamp to prevent contact between the plastic sheet and the imprint stamp.

The imprint stamp may be formed of a quartz plate.

Advantageous Effects

According to the present embodiment, a nano pattern can be fabricated on a plastic sheet having less roughness than that of a semiconductor substrate or a glass substrate. Also, the plastic sheet having the nano pattern thereon can be easily attached to a desired substrate using plasma treatment or adhesive. Thus, the plastic sheet can be attached to a diagnosis kit for a bio-plastic diagnosis kit or an exterior packaging material of an optical device, for example, an outer portion of a window of a packaging can of the optical device or an outer portion of a dome-shaped plastic of a light emitting device. This enhances radiation efficiency with low production costs.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Embodiments of the present invention will now be described in detail with reference to the accompanying drawings. In the following description, well-known functions and constructions are not described in detail since they would obscure the intention in unnecessary detail. Also, the same reference signs are used to designate the same or similar components throughout.

Figure 1:
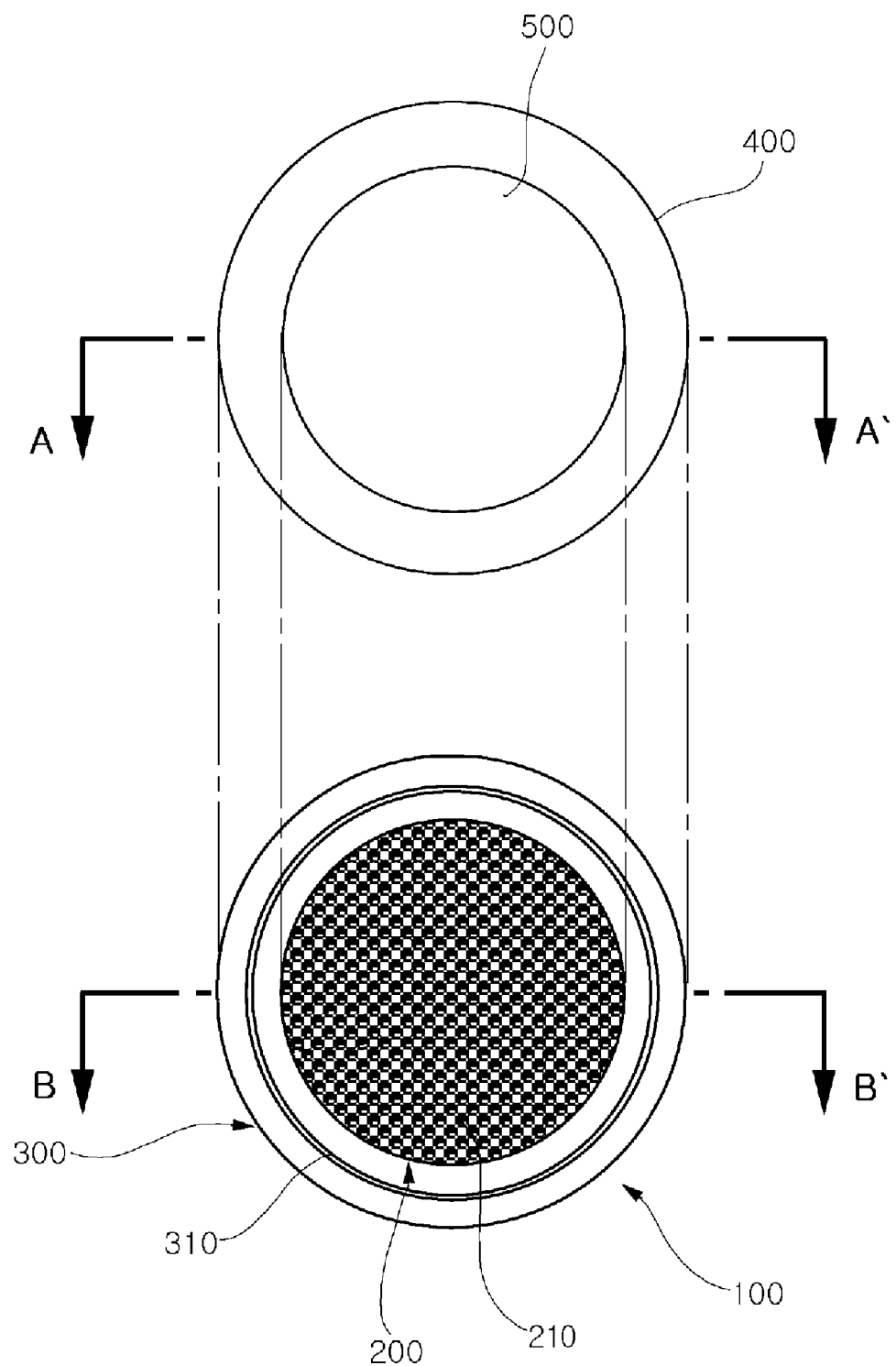
FIG. 1 is a plan view illustrating an apparatus for fixing a plastic sheet according to an exemplary embodiment of the invention.

FIG. 1 illustrates an apparatus for fixing a plastic sheet according to an exemplary embodiment of the invention. In the present embodiment, the plastic sheet is illustrated as a plastic sheet 500.

Referring to FIG. 1, the apparatus for fixing a plastic sheet includes a pair of planar metal guide rings 400, and a sheet fixing chuck 100. The sheet fixing chuck 100 includes a sheet fixer 200, and a ring fixer 300 having the pair of planar metal guide rings 400 fixed thereto.

The sheet fixing chuck 100 is made of aluminum or stainless steel. The sheet fixer 200 is provided in a central portion thereof with a plurality of vacuum pin holes 210 for sucking the plastic sheet.

These vacuum pin holes 210 prevent the plastic sheet 500 from departing from the sheet fixer 200 when the plastic sheet 500 is imprinted.

Also, the ring fixer 300 has a vacuum groove 310 formed along an outer periphery, thereby allowing the planar metal guide rings 400 to be sucked and fixed to the sheet fixing chuck 100.

Moreover, the planar metal guide rings 400 are paired to interposingly fix the plastic sheet 500 from above and below.

Figure 2:
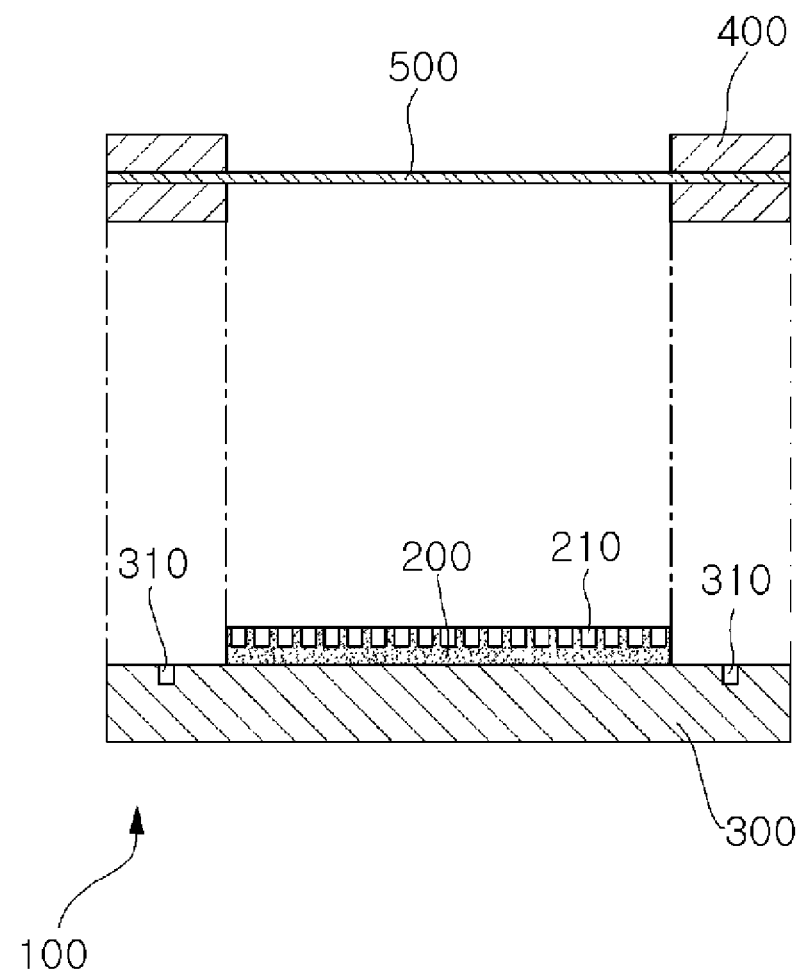
FIG. 2 is a cross-sectional view illustrating a pair of planar metal guide rings and a sheet fixing chuck, taken along lines A-A', and B-B' according to an exemplary embodiment of the invention.

FIG. 2 is a cross-sectional view illustrating the pair of planar metal guide rings 400 and the sheet fixing chuck 100 shown in FIG. 1, taken along lines A-A', and B-B' according to an exemplary embodiment of the invention. That is, a description will be given of a structure where the pair of planar metal guide rings 400 interposingly fixing the plastic sheet 500 are fitted to the sheet fixing chuck 100 in order to fabricate a nano pattern on the plastic sheet 500.

Referring to FIG. 2, the plastic sheet 500 is fixed as tightly as possible without bending between the pair of planar metal guide rings 400.

The plastic sheet 500 used is made of polyethylene terephthalate (PET), polyethersulfone (PES), cyclo olefin copolymer (COC), polymethyl methacrylate or poly methyl 2-methylpropanoate (PMMA), which are predominantly used for a medical and optical substrate, and has a thickness of 1000 um or less.

As described above, the planar metal guide rings 400 having the plastic sheet 500 fixed therebetween are fixed to the ring fixer 300 of the sheet fixing chuck 100 by vacuum suction.

Here, the plurality of vacuum pin holes 210 formed allow the plastic sheet prone to bending to be firmly fixed to the sheet fixer 200 without undergoing warping or grooving.

In addition, the planar metal guide rings 400 are fastened to the sheet fixing chuck 100 by suction from the vacuum groove 310 of the ring fixer 300.

In the present embodiment, the vacuum pin holes 210 and the vacuum groove 310 may be connected via a pipe to form a vacuum line. However, a structure for forming the vacuum will not be described in detail.

Now, a method of fabricating a nano pattern on a plastic substrate using an apparatus for fixing a plastic sheet will be described with reference to FIG. 3 according to an exemplary embodiment of the invention.

Figure 3:
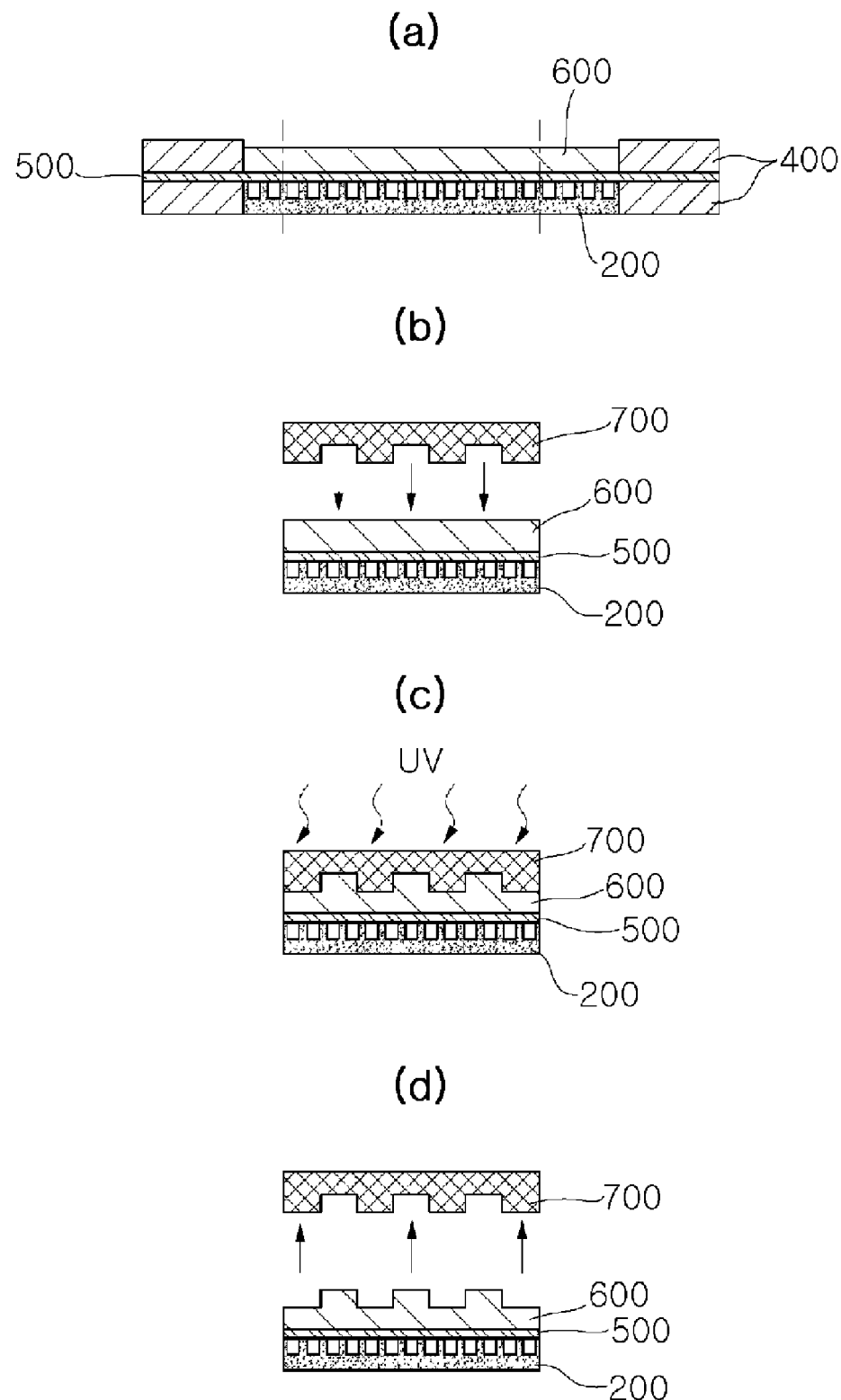
FIG. 3 is cross-sectional view illustrating a method of fabricating a nano pattern on a plastic sheet using an apparatus for fixing a plastic sheet according to an exemplary embodiment of the invention.

FIG. 3 sequentially illustrates the method of fabricating the nano pattern on the plastic sheet according to an exemplary embodiment of the invention. First, the nano pattern is imprinted on a plastic sheet 500 using imprinting equipment (not shown) provided with an imprint stamp 700 which has a nanometer pattern embossed or depressed on a rigid material such as a quartz plate.

Referring to (a) of FIG. 3, the plastic sheet 500 is fixed by the pair of planar metal guide rings 400 and fixed to the ring fixer 300. Then, the plastic sheet 500 is fixed to the sheet fixer 200 by suction from the vacuum pin holes 210 formed in the sheet fixer 200.

The sheet fixing chuck 100 and the pair of planar metal guide rings 400 are used to fix the substrate during imprinting. As shown in FIG. 1, the sheet fixing chuck 100 includes the sheet fixer 200 having the plurality of vacuum pin holes 210 formed therein and the ring fixer 300 having the vacuum groove 310 formed around an outer periphery thereof to thereby fix the pair of planar guide rings 400.

Subsequently, referring to (b) of FIG. 3, when the plastic sheet 500 is fixed to the sheet fixer 200 of the sheet fixing chuck 100, an ultraviolet (UV)-curable acrylate polymer resin 600 is coated on the plastic sheet to a thickness at least 1.5 times greater than a maximum depth of a pattern of the imprint stamp 700 using a dispenser (not shown).

Here, the dispenser used for coating the resin may be configured as a single or multiple nozzles or in a linear shape. In the present embodiment, the dispenser is not limited to a specific shape.

In addition, when the acrylate-based polymer resin 600 is completely coated, the vacuum pin holes 210 maintain a vacuum state so that the plastic sheet 500 is not detached from the sheet fixer 200 of the sheet fixing chuck 100.

Next, referring to (c) of FIG. 3, when the plastic sheet 500 is thoroughly fixed by vacuum suction, one of the plastic sheet 500 and the imprint stamp 700 is moved vertically to be brought into soft contact with each other. Here, an appropriate gap between the plastic sheet 500 and the imprint stamp 700 is preset using a location control sensor. This prevents the imprint stamp 700 and the plastic sheet 500 from being fitted tightly to make hard contact with each other.

In the case of general optical lithography equipment or imprinting equipment, a sensor is installed on a substrate part, a mask or a stamp part to prevent a substrate, mask or stamp from being impaired. Therefore, no additional sensor needs to be installed in the apparatus for fabricating the nano pattern according to the present embodiment. Accordingly, the location control sensor will not be described in any detail. However, an adequate set value needs to be inputted to prevent hard contact between the substrate and the stamp in view of a thickness of the substrate and a maximum depth of the stamp.

By this manufacturing method, the plastic sheet 500 does not come in direct contact with the imprint stamp 700. Thus, the nano pattern can be fabricated on the plastic sheet 500 via the imprint process regardless of flatness of the substrate.

Subsequently, when the plastic sheet 500 makes a soft contact with the imprint stamp 700, UV wavelength and time are set to allow the coated acrylate polymer resin 600 to be sufficiently UV-cured.

Afterwards, as shown in (d) of FIG. 3, when the acrylate polymer resin 600 coated is completely UV-cured, the plastic sheet 500 and the imprint stamp 700 are removed. A residual layer is left on a bottom of the pattern formed. The residual layer is removed via a general etching method such as reactive ion etching (RIE) or inductively coupled plasma (ICP) etching.

Also, an adhesion layer of the substrate or an anti-adhesion layer of the stamp not described above can be treated in an identical manner to surface treatment in a general imprint process. The general imprint process is applicable to other following processes.

Furthermore, the polymer resin coated according to the present embodiment has a thickness controlled by forming a step along an edge of an upper one of the planar guide rings 400 for flattening the substrate. That is, the step of the upper planar guide ring prevents the coated resin from overflowing. Also, the step for preventing overflow of the coated resin may be formed in a height at least two times greater than a maximum depth of a desired stamp. Of course, an amount of the coated resin is regulated to minimum nanometer by the dispenser (not shown).

A semiconductor thin film, an oxide or a nitride thin film, a metal thin film or a bio material may have to be additionally formed on the nano pattern formed on the plastic sheet manufactured by the aforesaid method. Then, such an additional film is previously formed and then this resultant plastic sheet manufactured by sawing can be attached onto a plastic substrate, a glass or a semiconductor substrate to suit purposes using adhesive or plasma treatment. Of course, the plastic sheet can be manufactured by sawing and attached immediately onto the plastic substrate, glass or semiconductor substrate when the aforesaid additional film does not need to be formed on the nano pattern of the plastic sheet.

As set forth above, according to exemplary embodiments of the invention, a nano pattern can be formed on a plastic sheet, regardless of type of a substrate to be applicable therewith, such as the semiconductor substrate and glass substrate. Moreover, the nano pattern can be formed on the plastic sheet and thus employed for manufacturing a bio kit and an external pattern for increasing light emitting efficiency of an optical device.

While the present invention has been shown and described in connection with the preferred embodiments, it will be apparent to those skilled in the art that modifications and variations can be made without departing from the spirit and scope of the invention as defined by the appended claims.

The invention claimed is:

1. An apparatus for fixing a plastic sheet comprising:
   a pair of planar metal guide rings operable to interposingly fix a plastic sheet having a thickness of 1000 um or less from above and below, respectively during an imprinting process for imprinting a nano pattern on the plastic sheet; and
   a sheet fixing chuck comprising:
      a ring fixer sucking the pair of planar metal guide rings through a vacuum groove to be fixed thereto; and
      a sheet fixer having a plurality of vacuum pin holes formed therein, the vacuum pin holes sucking a bottom of the plastic sheet fixed by the planar metal guide rings.

2. The apparatus of claim 1, wherein the vacuum groove is formed along an outer periphery of the sheet fixing chuck so as to suck the planar metal guide rings.

3. A method of fabricating a nano pattern using an apparatus for fixing a plastic sheet, the method comprising:
   sucking, during an imprinting process for imprinting a nano pattern on the plastic sheet, a pair of planar metal guide rings interposingly fixing a plastic sheet from above and below to be fixed to a ring fixer, the plastic sheet having a thickness of 1000 um or less, and sucking a bottom of the plastic sheet through a plurality of vacuum pin holes formed in a sheet fixer to be fixed to the sheet fixer;
   coating an ultraviolet-curable polymer resin on the plastic sheet;
   pressing the coated polymer resin with an imprint stamp having a nano pattern;
   ultraviolet-curing the polymer resin; and
   removing the imprint stamp from the substrate.

4. The method of claim 3, further comprising attaching the plastic sheet having the nano pattern thereon onto one of a plastic substrate, a glass substrate and a semiconductor substrate using one of plasma treatment and adhesive.

5. The method of claim 3, wherein the ultraviolet-curable polymer resin is acrylate-based.

6. The method of claim 3, wherein the coating an ultraviolet-curable polymer resin comprises coating the polymer resin to a thickness greater than a maximum depth of the pattern of the imprint stamp to prevent contact between the plastic sheet and the imprint stamp.

7. The method of claim 3, wherein the imprint stamp is formed of a quartz plate.

* * * * *